United States Patent [19]

Jones et al.

[11] Patent Number: 4,940,983
[45] Date of Patent: Jul. 10, 1990

[54] A/D CONVERTERS

[75] Inventors: Roger E. Jones, Cambridge; John A. Phillips, Harlow; Bruce Dunnett, Cupar, of Great Britain

[73] Assignee: Stc PLC, London, England

[21] Appl. No.: 261,242

[22] Filed: Oct. 21, 1988

[30] Foreign Application Priority Data

Dec. 5, 1987 [GB] United Kingdom ............... 8728497
Sep. 22, 1988 [GB] United Kingdom ............... 8822360

[51] Int. Cl.$^5$ ............................................. H03M 1/38
[52] U.S. Cl. .................................... 341/171; 341/163; 505/827
[58] Field of Search ............... 341/171, 149, 126, 163, 341/165, 161, 155; 505/827

[56] References Cited

U.S. PATENT DOCUMENTS

| | | | |
|---|---|---|---|
| 3,983,419 | 9/1976 | Fang | 341/171 X |
| 4,258,354 | 3/1981 | Carmon et al. | 340/309.4 |
| 4,315,255 | 2/1982 | Harris et al. | 341/171 |
| 4,504,153 | 3/1985 | Schollmeyer et al. | 368/10 |
| 4,672,359 | 6/1987 | Silver | 341/171 X |
| 4,682,299 | 7/1987 | McIntosh et al. | 364/569 |
| 4,695,954 | 9/1987 | Rose et al. | 364/413 |
| 4,768,177 | 8/1988 | Kehr et al. | 368/10 |

FOREIGN PATENT DOCUMENTS

| | | |
|---|---|---|
| A20135671 | 4/1985 | European Pat. Off. . |
| A20174105 | 3/1986 | European Pat. Off. . |
| 861282 | 2/1961 | United Kingdom . |
| 967364 | 8/1964 | United Kingdom . |
| 970159 | 9/1964 | United Kingdom . |
| 982198 | 2/1965 | United Kingdom . |
| 1475847 | 6/1977 | United Kingdom . |
| 2213267 | 8/1989 | United Kingdom . |

Primary Examiner—William M. Shoop, Jr.
Assistant Examiner—Sharon D. Logan
Attorney, Agent, or Firm—Lee, Mann, Smith, McWilliams & Sweeney

[57] ABSTRACT

A successive approximation analogue to digital converter including at least one superconducting loop (FIG. (3-30; FIG. 8-68). Superconducting loops (61-64) may be used to store flux quanta used as reference levels in a digital to analogue converter of the analogue to digital converter. Alternatively, non-superconducting reference inductors (FIG. 3-38) can provide flux quanta reference levels. Switchable screens (34; 66) are interposed between the flux quanta stores and lobes (31; 74) in an addition/subtraction superconducting loop (30; 68). An analogue signal is sampled and the corresponding magnetic flux coupled to a sensing lobe (32; 71) and concentrated at a flux concentrating lobe (33; 72). The reference fluxes are selectively coupled into the addition/substraction superconducting loop until a magnetometer (40; 73) indicates zero net flux through the concentrating lobe, this corresponding to completion of the conversion.

10 Claims, 3 Drawing Sheets

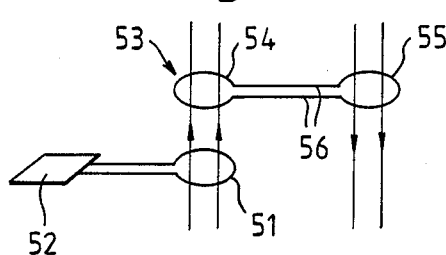
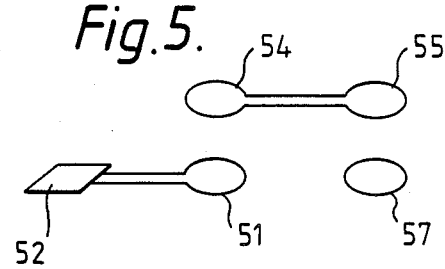
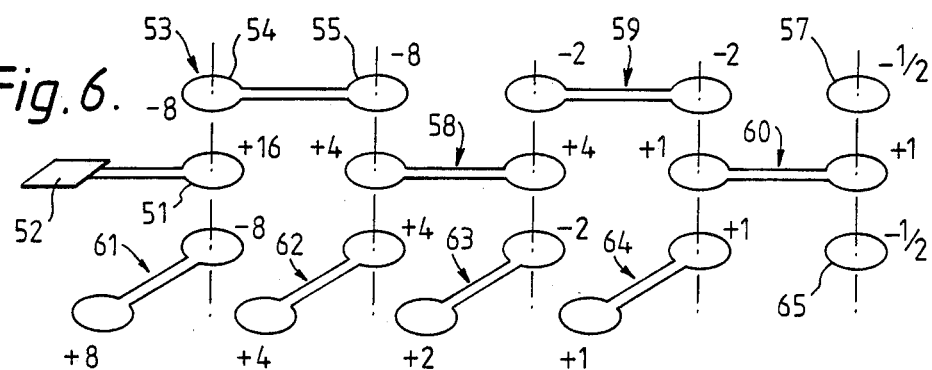
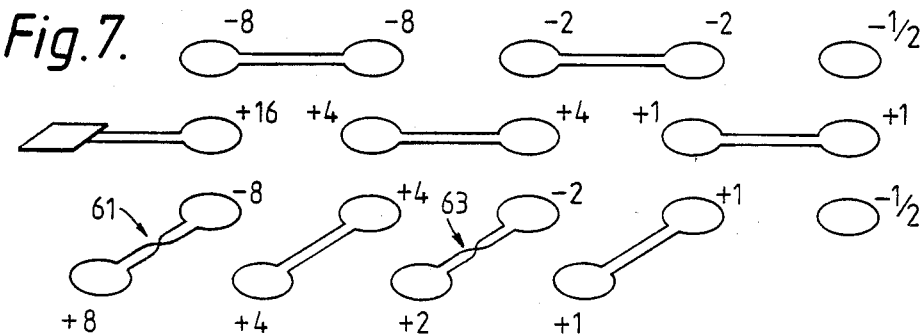

A/D CONVERTERS

BACKGROUND OF THE INVENTION

This invention relates to signal encoders/decoders, and in particular to A/D (analogue to digital) converters and to devices such as flux reference stores therefor.

A typical successive approximation A/D converter is illustrated in FIG. 1 of the accompanying drawings. It comprises an input 1, a sample and hold 2, a comparator 3, a successive approximation register 4, which itself comprises a digital register and control circuits therefor, and an n-bit D/A converter 5, and produces a n-bit parallel digital output as indicated. The converter of FIG. 1 basically operates as follows, namely: an input analogue signal sample, for example, voltage, current or some other parameter, is taken by the sample and hold 2 and this sample is successively classified to the nearest $\frac{1}{2}$, $\frac{1}{4}$, $\frac{1}{8}$, 1/16 etc. of a maximum intended "full scale" value, to determine the digital equivalent. The numbers in the digital register of the register 4 are initially all set to zero by means of the control circuits. Then the control circuits set the highest order digit to "1", the resulting digital number is converted to an analogue value in the converter 5 and is compared with the sampled input value at the comparator 3. If the input value is equal to or larger than the converted value the register digit is left at "1", otherwise it is reset to "0". Then the next highest digit is set to "1", the resulting digital number converted to an analogue value and compared with the input value sample, and so on. At the conclusion the digital representation of the analogue value is stored in the register and may be transmitted from the register in parallel form.

A limit to the production of high-speed high-accuracy A/D converters is the need for a range of precision references (resistances) in the D/A converter 5 used in the successive approximation loop. Furthermore, a high accuracy comparator is needed.

BRIEF DESCRIPTION OF THE INVENTION

According to one aspect of the present invention there is provided a successive approximation analogue to digital converter including at least one superconducting loop.

According to another aspect of the present invention there is provided a successive approximation n-bit analogue to digital converter including a digital to analogue converter comprising superconducting loops for storing flux quanta which are used as reference levels.

According to a further aspect of the present invention there is provided a successive approximation n-bit analogue-to-digital converter comprising a superconducting loop having a sensing loop, a magnetic flux concentrating loop and n further loops; a non-superconducting drive loop; means for generating n reference magnetic fluxes, means for selectively coupling each reference magnetic flux with a respective one of the n further loops; means for selectively coupling magnetic flux at the drive loop to the sensing loop whereby a signal in the drive loop is, in use, sampled and a corresponding magnetic flux linked to the superconducting loop; and a magnetometer for detecting the magnetic flux at the concentrating lobe.

According to yet another aspect of the present invention there is provided an arrangement for converting a static magnetic flux into a dc current comprising a non-superconducting loop it which a first current is passed to generate said static magnetic flux, a superconducting flux transformer one lobe of which is aligned with said non-superconducting loop for linking of said static magnetic flux thereto, another lobe of said superconducting flux transformer being aligned with a single loop snare superconducting circuit whereby to link said static magnetic flux to said snare superconducting circuit and generate the said dc current therein.

According to a further aspect of the present invention there is provided a successive approximation n-bit analogue-to-digital converter comprising a non-superconducting drive loop, a superconducting loop having a sensing loop aligned with the drive loop, a magnetic flux concentrating loop and n further lobes, and comprising a respective non-superconducting reference inductor of a series of n reference inductors for each further loop, which reference inductors are aligned with the further loops, a respective superconducting screening pad disposed between each reference inductor and the associated further loop in a non-contacting manner, means for selectively rendering the screening pads non-superconducting, the series of reference inductors generating reference magnetic flux values corresponding to the sequence $1,2,4,8, \ldots 2^{n-1}$, and comprising a magnetometer aligned with the flux concentrating lobe of the superconducting loop for detecting the magnetic flux thereat, and wherein in use magnetic flux corresponding to a sampled analogue signal is coupled to the superconducting loop from the drive loop and concentrated at the flux concentrating lobe and the reference magnetic fluxes are selectively switched into the superconducting loop, by rendering the respective screening pads non-superconductive, zero net flux measured by the magnetometer corresponding to the completion of the analogue-to-digital conversion.

According to still another aspect of the present invention there is provided a magnetic flux reference store comprising a succession of superconducting circuits arranged to produce a series of n flux reference values from a single input flux value.

BRIEF DESCRIPTION OF THE DRAWINGS

Embodiments of the invention will now be described with reference to FIGS. 2 to 8 of the accompanying drawings in which:

FIG. 4 illustrates a view of a two-layer arrangement linking magnetic flux to a superconducting flux transformer loop;

FIG. 5 illustrates a view of a two-layer arrangement for converting magnetic flux to electric current;

FIG. 6 illustrates a view of a three-layer arrangement of flux transformer loops;

FIG. 7 illustrates a view of a three-layer arrangement of flux transformer loops which comprises a flux reference store.

DESCRIPTION OF THE PREFERRED EMBODIMENTS

A current induced in a loop of superconducting material will persist, unless conditions of temperature and external magnetic field change sufficiently to render the loop non-superconducting. As a result of such a circulating current there is generated a magnetic flux passing through the "hole" of the loop, which magnetic flux has a fixed and quantised value. The magnetic flux is an integer multiple of the fundamental quantum $h/2e$, where h is Plancks constant and e is the electronic charge.

When a particular current i is circulating in a simple superconducting loop 10 (FIG. 2a), there is a particular magnetic flux O through the loop. The magnetic flux O is given by $O=Li$, where L is the inductance of the loop.

Figure 1:
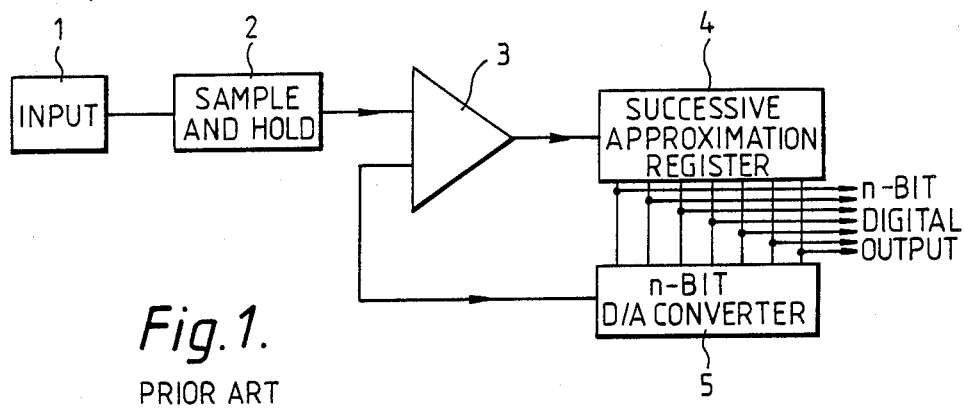
Figure 2A:
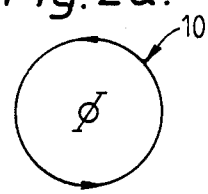
FIGS. 2a, 2b and 2e illustrate three forms of superconducting loops.
Figure 2B:
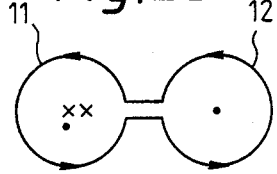

Whereas FIG. 2a illustrates single lobe loop, FIG. 2b illustrates a two lobe loop with the lobes 11 and 12 being of equal sizes. The circulation of a particular current through the loop of FIG. 2b generates a corresponding first magnetic flux value through the overall aperture of the circuit (loop). Magnetic flux is conserved within a superconducting loop, hence if more magnetic flux is added to that passing through lobe 11, say, in the direction into the paper as indicated by the two crosses (xx), there will result an equal and opposite magnetic flux in the overall circuit which is distributed within the circuit according to the inductance of each lobe. Since the areas are equal, the inductances are equal and half of the generated flux will appear in each loop, as indicated by the dots ( ). The overall result is that half of the flux added to lobe 11 appears inverted at loop 12 and flux transfer has occurred.

Figure 2C:
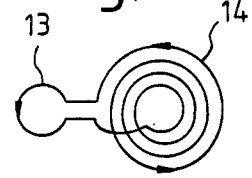

Such lobe structures and other multi-lobe structures enable coupling between various superconducting loops as will be apparent from the following. Furthermore and as disclosed in our GB Application No. 8822361.5(Serial No..........) (R. E. Jones 26-6-2-2X) a superconducting flux transformer can be achieved by means of a superconducting circuit (loop) with two lobes 13, 14 of different inductances FIG. 2c). This be achieved by replacing one "circular" loop with a spiral, thus forming a two dimensional inductor, the interior area of the lobe 13 and the spiral being the same. A current circulating in the circuit of FIG. 2c generates a certain magnetic flux through the overall aperture of the loop. When extra magnetic flux it added to loop 13 an extra current it generated which produces equal and opposite flux within the circuit. The generated flux is distributed according to the relative inductances, so that the flux in the spiral 14 is the fraction $L_{14}/(L_{13}+L_{14})$ of the extra applied flux, where $L_{13}$ and $L_{14}$ are the inductances of the lobes 13 and 14, respectively. Since the interior areas of the two lobes are equal but there is more generated flux in the spiral 14, the flux is more concentrated and there is increased field strength at the spiral 14 relative to the lobe 13.

Figure 3:
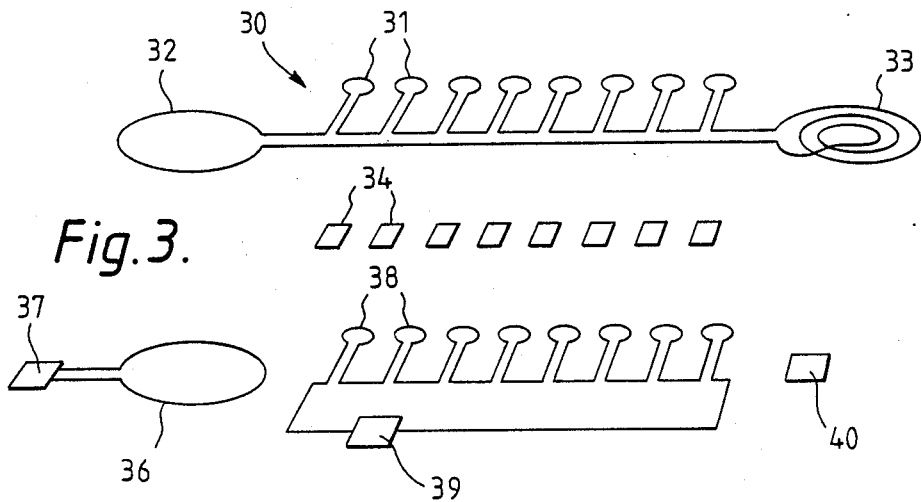
FIG. 3 illustrates an exploded view of a scheme for a three-layer structure analogue to digital converter based on a superconducting loop.

A basic scheme for a successive approximation analogue to digital converter employing superconducting element is illustrated in FIG. 3. It comprises three layers. The top layer consists of an unbroken subtraction/addition superconducting circuit 30 with eight lobes 31, one lobe 31 for each bit of the ADC, an 8-bit ADC being illustrated, a sense loop 32 and a two-dimensional spiral inductor 33. The middle layer comprises a series of superconducting screening pads 34 a respective one aligned with each of the loops 31. When a sufficiently large current is provided to any of the pads 34 it will be driven into a normal (non-superconducting) state and flux in a corresponding inductor 38 will be linked to the loop 31 aligned therewith. The screening pads 34 are connected to a current switching network (not shown in FIG. 3) which can drive any permutation of the pads into the normal state, thus providing switchable barriers to magnetic flux. In the bottom layer loop 36 comprises a drive loop (non-superconducting) connected to a signal input indicated by 37. The drive loop 36 is aligned with sense loop 32. Aligned with each of the series of lobes 31 and the respective screening pads 34 is a respective spiral flux reference inductor 38 of a series of, for example, spiral flux reference inductors which have various numbers of turns according to the sequence 1,2,4,8,16 . . . 128. The inductors can be other than spiral, although the latter it currently preferred. The spiral reference inductors are connected to a current source 39. All of the conducting elements in the bottom layer are of non-superconducting material, such as copper. Also in the bottom layer is a magnetometer (comparator) 40, such as a Hall-effect device, which is aligned directly below the top layer inductor 33.

To perform an analogue-to-digital conversion with the arrangement of FIG. 3, a sample of an input analogue signal to be converted is taken at a predetermined time and applied to the drive loop 36. Whereas a sample and hold device may be employed, such will be unnecessary if the conversion takes place at a sufficiently rapid rate, particularly if the least significant digit does not change during the sampling time. A corresponding flux is produced in the spiral inductor 33 and detected by the comparator 40. Reference fluxes are then successively switched into the superconducting circuit 30 by applying current to or removing current from the various screening pads 34 until the net flux in the circuit 30, as measured by the comparator 40, is zero. When this occurs the digital representation of the input analogue signal is given in the usual manner for a successive approximation converter by an n-bit word (n=8 in the present example), consisting of zeros and ones, determined by which of the eight spiral inductors 38 are contributing flux to the circuit, in other words which of the screening pads 34 are rendered non-superconducting.

The very fast switching times possible when there are no capacitive delays, as in the present case, combined with the high accuracy associated with the flux generated by the reference inductors 38, results in a high precision, high speed, analogue-to-digital converter.

The reference inductors 38 and source 39 constitute a reference flux store when current is flowing. Another form of a reference flux store which employs superconducting loops will be described in the following. This uses magnetic flux snares which will be described first.

In FIG. 4 there is illustrated a two layer system including a loop 51 made of a normal conducting material (non-superconducting) such as copper wire, which is connected to a d.c. current source 52. The current source 52 supplies a current $I_1$ which passes around the loop 51. The loop has elf inductance $L_1$. In such a situation a magnetic flux $\Phi_1$ passing through the loop 51 is generated, such that $\Phi_1 = L_1 I_1$. Reference numeral 53 indicates a superconducting flux transformer loop which has a lobe 54 at one end and a lobe 55 at the other end. The loop 51 is in one layer and loop 53 is in a parallel layer with loop 54 aligned with loop 51 and the flux $\Phi_1$ is entirely linked by one end of the superconducting flux transformer loop 53, namely lobe 54. Since a closed superconducting loop must conserve magnetic flux, loop 53 will pass a current $I_2$ to generate an equal and apposite flux $\Phi_2$. If the self inductance of the loop 53 is $L_2$, where $L_2$ is the sum of the inductances of the two lobes 54 and 55 plus the inductance of the joining strips 56, i.e. $L_2 = L$ (lobe 54) $+ L$ (strips) $+ L$ (lobe 55), then $\Phi_2 = L_2 I_2 = -\Phi_1$. If L(lobe 54) = L (lobe 55) and L (lobe 55) L(Strips), then the transformer loop responds by generating $-\Phi/2$ units of flux at each lobe 54 and 55 and the resultant situation has net flux $\Phi_1/2$ linked by lobe 54 and loop 51, and flux $-\Phi_1/2$ linked by lobe 55.

If a flux snare 57 is added to the system as illustrated in FIG. 5, the snare 57 being in the same layer as loop 51, the result it different. The flux snare is comprised by a stand-alone superconducting loop aligned with lobe 55.

For example, assume that +16 units of flux are generated in the normal loop 51. The transformer responds, as in the arrangement of FIG. 4, by generating −8 units of flux at each lobe in order to cancel out the +16 units. However, in the case of FIG. 5, the −8 units in lobe 55 are linked by the snare 57 which itself must conserve flux. Therefore it passes a current through its inductance $L_3$ (=L(lobe 55)=L(lobe 54)) to produce +8 units of flux. Now the transformer loop 53 is seeing +16 plus +8 = +24 units of flux, so it must increase its current to produce −12 units at each end. The snare responds by generating +12 units. This process is repeated so that an equilibrium situation is approached asymptotically. From that time onwards the normal loop 51 and the snare 57 each generate +16 units of flux and lobes 54 and 55 each generate −16 units so that there is no net flux in any of the loops/lobes. However, currents now flow in the system such that I(snare)=I (loop 51)=2I (transformer loop 53) Thus a static magnetic flux in loop 51 is converted into a d.c. current in snare 57.

A three-layer system of flux transformers and flux snares based on those of FIGS. 4 and 5 can be used to produce a flux reference store, an example of which is illustrated in FIG. 7. However, FIG. 6 which indicates a somewhat similar arrangement will first be referred to. Reference numeral 51 again denotes a normal conducting loop and reference numeral 52 a d.c. current source. Reference numeral 53 again denotes a superconducting flux transformer loop with lobes 54 and 55 at its ends. Reference numerals 58, 59 and 60 denote similar superconducting flux transformer loops whose lobes are aligned in a network as indicated. Reference numerals 61, 62, 63 and 64 denote similar superconducting flux transformer loops one lobe of each of which it aligned (as indicated by dashed lines) with two other loops/lobes so that there are triplets of loops/lobes linking flux. Reference numerals 57 and 65 denote snares comprising stand-alone superconducting loops. All of the lobes have identical inductance L which is equal to that of the snare loops. The connecting strips of the flux transformer loops are considered to have negligible inductance.

It is assumed, for example, that current source 52 provides current in the normal loop 51 which generates a flux of +16 units therethrough. This flux is linked by transformers 53 and 61. These transformers must conserve flux and the only way theY can do this is by generating −8 units of flux in each of their lobes. Thus there is no net flux in the loop 53/loop 51/loop 61 triplet. However, the −8 units at loop 5 of transformer loop 53 are linked by transformer loops 58 and 62. These two loops conserve flux by generating +4 units in each end lobe so that once again the net flux in the triplet is zero. The process continues down the line of triplets, terminating with transformer loop 60 and the two flux snares 57 and 65, which each generate $-\frac{1}{2}$ unit of flux. The flux transformers 61 to 64 are referred to as snare transformers. It should be noted that if these snare transformers were absent then the remaining loops would all contain either +16 or −16 units of flux.

The snare transformers each contain half the flux quantity of the preceding one and the lobes of the snare transformers not in the triplets contain fluxes of −8, +4, −2, +1 units respectively. For a reference store the polarities should all be the same. This can be achieved simply by arranging that the connecting strips of half of the snare transformers cross over, such as transformers 61 and 63 to achieve reference fluxes of +8, +4, +2, +1 units respectively as illustrated in FIG. 7, or alternatively (not shown) with transformers 62 and 64 crossed over, reference fluxes of −8, −4, −2, −1 units respectively.

Figure 8:
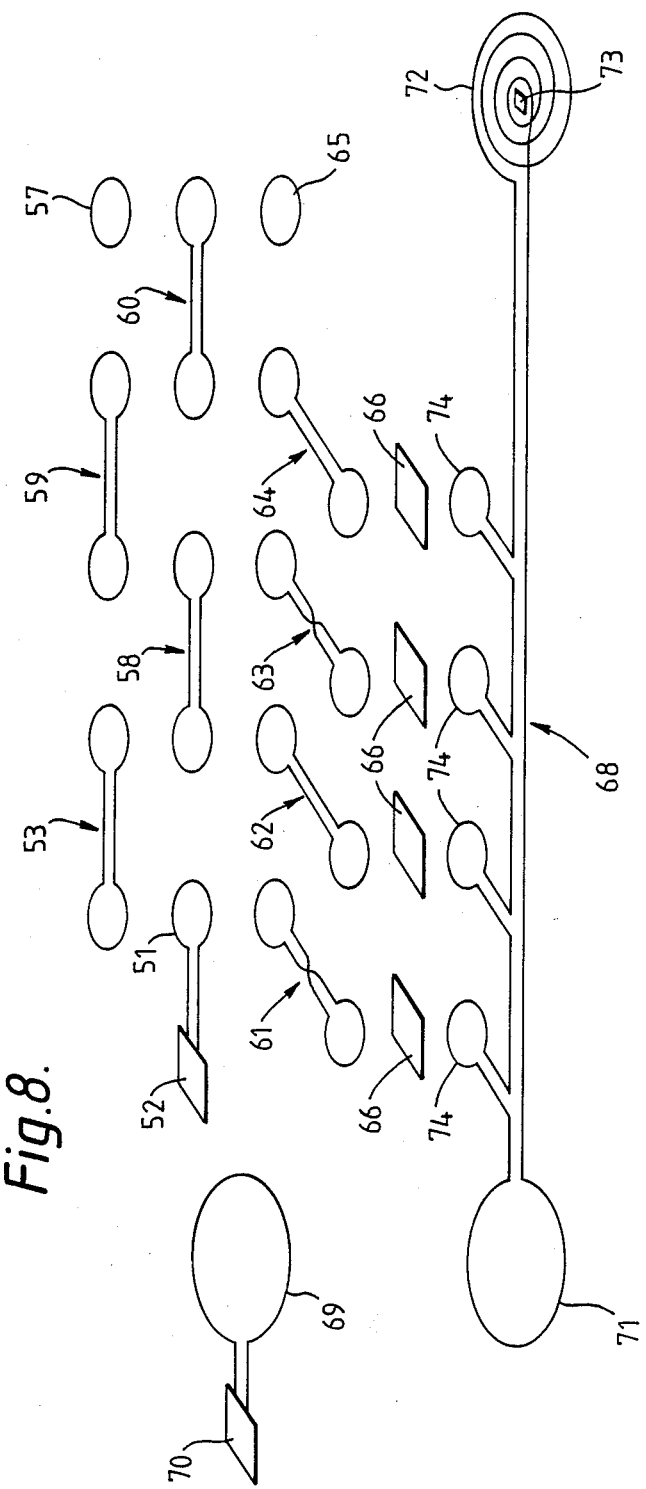
FIG. 8 illustrates a five-layer arrangement which comprises an analogue to digital converter employing superconducting loops and which incorporates the flux reference store of FIG. 7.

The flux reference store of FIG. 7 can be used as the basis of a magnetic flux analogue-to-digital converter as illustrated in FIG. 8. This is a five layer structure and includes in addition to the three layers of FIGS. 6 and 7, a layer including shields 66 and a layer including a collector (addition/subtraction) superconducting loop 68. The collector loop 68 has four lobes 74, one lobe 74 for each bit of the analogue-to-digital converter (ADC), a 4-bit ADC being illustrated, a sense loop 71 and a two-dimensional spiral inductor 72. A magnetometer (comparater) is required to be used as a null-field detector. This may be comprised by a Hall effect device 73 disposed within inductor 72. The inclusion of a spiral inductor 72 in loop 68 means that any flux linked by loop 68 will be concentrated at inductor 72.

The shields 66 are superconducting screening pads which are each connected to a current source via a switching circuit (not shown). If the current source provides a sufficiently large current to a shield then it will be driven to a normal (non-superconducting) state and flux linked to one loop, say of snare transformer 61 will be passed through shield 66 and linked to corresponding loop 74. Otherwise, when there is no current or it is too low, the shields 66 provide barriers to magnetic flux.

Loop 69 is a non-superconducting drive loop which is connected to signal to be converted, which is indicated by a signal source 70. The drive loop 69 is aligned with the sense loop 71. Aligned with each of the lobes 74 of the collector loop 68 is a respective shield 66 and a respective loop of one of the snare transformers 61 to 64 which is not in the triplet and which provides a reference flux value.

To perform an analogue-to-digital conversion with the arrangement of FIG. 8, a current is passed through the normal loop 51 corresponding to +16 units of flux and the flux reference store generates the reference values (+8,+4,+2,+1) at the lobes of snare transformers 61 to 64 not in the triplets, as described above. The shields 66 are all initially superconducting. The analogue signal to be converted is sampled and applied to the drive loop 69 and generates a corresponding magnetic flux passing therethrough, and the magnetic flux is linked to sense loop 71. Due to the spiral inductor 72 the magnetic flux linked to the collector loop 68 it concentrated at the spiral inductor and detected by the Hall-effect device 73. The reference fluxes are then successively switched in to the collector loop 68, by applying current to/removing current from the various shields 66, until the net flux in the collector loop 68, as measured by the Hall-effect device 73, is zero. When this occurs the digital representation of the sampled input analogue signal is then given in the usual manner for a successive approximation converter by an n-bit word (n=4 in the present example) consisting of zeros and ones, determined by which of the snare transformers 61 to 64 are contributing flux to the collector loop, in other words which of the shields 66 are rendered non-superconducting.

The various superconducting and other structures refered to above are amenable to production in various ways. In view of the multilayer structured nature, screen-printing, MOCVD, or sputtering, with the various layers separated by insulating material, may be appropriate. Superconducting loops maY be provided by such means or alternatively superconducting wire may be formed into the loops. The non-superconducting loops may be similarly formed. Advantageously, but not necessarily, the newer superconducting materials with higher operating temperatures are employed. Possible superconducting materials which can be employed are niobium—niobium nitride (4.2K), $YBa_2Cu_3O_{7-x}$ (95K) or thallium based compounds (125K).

The high speed, high accuracy analogue to digital converters provided by the present invention are particularly applicable to data acquisition systems, such as at the front ends of radars systems, for digital radio, or for other fast signal processing requirements.

We claim:

1. A successive approximation n-bit analogue to digital converter including an addition/subtraction superconducting loop having a sensing lobe, a magnetic flux concentrating lobe and n further lobes; a non-superconducting drive loop to which an analogue signal to be converted is applied; superconducting loops for storing n flux quanta which are used as reference levels; control circuits for selectively coupling each flux quanta reference level with a respective one of the n further lobes; means for coupling magnetic flux at the drive loop to the sensing lobe whereby the analogue signal in the drive loop is in use sampled and a corresponding magnetic flux linked to the addition/subtraction superconducting loop; and a magnetometer for detecting the magnetic flux at the concentrating lobe.

2. A successive approximation n-bit analogue-to-digital converter comprising a superconducting loop having a sensing loop, a magnetic flux concentrating lobe and n further lobes; a non-superconducting drive loop; means for generating n reference magnetic fluxes; means for selectively coupling each reference magnetic flux with a respective one of the n further lobes; means for selectively coupling magnetic flux at the drive loop to the sensing lobe whereby a signal in the drive loop is, in use, sampled and a corresponding magnetic flux linked to the superconducting loop; and a magnetometer for detecting the magnetic flux at the concentrating lobe.

3. An analogue-to-digital converter as claimed in claim 2 wherein said means for selectively coupling magnetic flux comprise respective superconducting screens and means for selectively rendering them non-superconducting when flux is required to be coupled.

4. An analogue-to-digital converter as claimed in claim 2 wherein the magnetometer is a Hall effect device.

5. An analogue-to-digital converter as claimed in claim 2, wherein the means for generating the n reference magnetic fluxes comprises a succession of superconducting circuits arranged to produce a series of n flux reference values from a single input flux value.

6. An analogue-to-digital converter as claimed in claim 5, wherein the superconducting circuits comprise n superconducting flux transformers and n snare flux transformers, the flux reference values being available at first lobes of the snare flux transformers.

7. An analogue-to-digital converter as claimed in claim 5 and including a further non-superconducting loop at which the single input flux value is generated, which further non-superconducting loop is aligned in a triplet with the second loop of a first snare transformer and a first lobe of a first said superconducting flux transformer; a second loop of the first said superconducting flux transformer being aligned in a triplet with a first loop of a second said superconducting flux transformer and the second lobe of a second said snare transformer; a second loop of the second said superconducting flux transformer being aligned in a triplet with a first loop of a third said superconducting flux transformer and the second lobe of a third said snare transformer; and so on, the second lobe of the n th said superconducting flux transformer being linked in a triplet with two single loop snare superconducting circuits, the reference flux value available at the first snare transformer comprising one half of the input flux value, the reference flux value available at the second snare transformer comprising one quarter of the input flux value, the reference flux value available at the third snare transformer comprising one eighth of the input flux value, and so on.

8. An arrangement for converting a static magnetic flux into a dc current comprising a non-superconducting loop in which a first current is passed to generate said static magnetic flux, a superconducting flux transformer one lobe of which is aligned with said non-superconducting loop for linking of said static magnetic flux thereto, another loop of said superconducting flux transformer being aligned with a single loop snare superconducting circuit whereby to link said static magnetic flux to said snare superconducting circuit and generate the said dc current therein.

9. A successive approximation n-bit analogue-to-digital converter comprising a non-superconducting drive loop, a superconducting loop having a sensing loop aligned with the drive loop, a magnetic flux concentrating loop and n further lobes, and comprising a respective non-superconducting reference inductor of a series of n reference inductors for each further loop, which reference inductors are aligned with the further loops, a respective superconducting screening pad disposed between each reference inductor and the associated further lobe in a non-contacting manner, means for selectively rendering the screening pads non-superconducting, the series of reference inductors generating reference magnetic flux values corresponding to the sequence $1, 2, 4, 8, \ldots 2^{n-1}$, and comprising a magnetometer aligned with the flux concentrating lobe of the superconducting loop for detecting the magnetic flux thereat, and wherein in use magnetic flux corresponding to a sampled analogue signal is coupled to the superconducting loop from the drive loop and concentrated at the flux concentrating lobe and the reference magnetic fluxes are selectively switched into the superconducting loop, by rendering the respective screening pads non-superconductive, zero net flux measured by the magnetometer corresponding to the completion of the analogue-to-digital conversion.

10. A magnetic flux reference store which produces a series of n flux reference values from a single input flux value, the store comprising a non-superconducting loop at which the single input flux value is generated, n superconducting flux transformers and n snare flux transformers, the flux reference values being available at first lobes of the snare flux transformers, the non-superconducting loop being aligned in a triplet with a second lobe of a first snare transformer and a first lobe of a first said superconducting flux transformer; a second lobe of the first said superconducting flux transformer being aligned in a triplet with a first lobe of a second said superconducting flux transformer and the second lobe of a second said snare transformer; a second lobe of the second said superconducting flux transformer being aligned in a triplet with a first lobe of a third said superconducting flux transformer and the second lobe of a third snare transformer; and a second lobe of the $n-1$th said superconducting flux transformer being aligned in a triplet with a first lobe of an nth said superconducting flux transformer and the second lobe of an nth said snare transformer, the second lobe of the nth said superconducting flux transformer being linked in a triplet with two single loop snare superconducting circuits, the reference flux value available at the first snare transformer comprising one half of the input flux value, the reference flux value available at the second snare transformer comprising one quarter of the input flux value, the reference flux value available at the third snare transformer comprising one eight of the input flux value, and the reference flux valve available at the nth snare transformer comprising $\frac{1}{2}n$ of the input flux valve.

* * * * *